United States Patent
Do

(10) Patent No.: US 9,679,865 B2
(45) Date of Patent: Jun. 13, 2017

(54) SUBSTRATE FOR SEMICONDUCTOR PACKAGE AND SEMICONDUCTOR PACKAGE HAVING THE SAME

(71) Applicant: SK hynix Inc., Icheon-si Gyeonggi-do (KR)

(72) Inventor: Eun Hye Do, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 132 days.

(21) Appl. No.: 14/253,554

(22) Filed: Apr. 15, 2014

(65) Prior Publication Data
US 2015/0131255 A1    May 14, 2015

(30) Foreign Application Priority Data

Nov. 8, 2013 (KR) .......................... 10-2013-0135339

(51) Int. Cl.
*H05K 7/00* (2006.01)
*H01L 23/00* (2006.01)
(Continued)

(52) U.S. Cl.
CPC ............. *H01L 24/49* (2013.01); *H05K 3/341* (2013.01); *H05K 3/4697* (2013.01); *H01L 24/45* (2013.01); *H01L 2224/05553* (2013.01); *H01L 2224/45144* (2013.01); *H01L 2224/45147* (2013.01); *H01L 2224/48228* (2013.01); *H01L 2224/49* (2013.01); *H01L 2924/00014* (2013.01);
(Continued)

(58) Field of Classification Search
CPC ... H01L 23/13; H01L 23/24; H01L 23/49816; H01L 23/3121; H01L 2924/01078–2924/01079; H05K 1/111; H05K 1/141; H05H 2201/10734
USPC ......... 361/767–774, 790–795; 174/250–264; 257/685–730
See application file for complete search history.

(56) References Cited

U.S. PATENT DOCUMENTS 5,468,999 A * 11/1995 Lin .......................... H01L 23/24
257/700
5,689,091 A * 11/1997 Hamzehdoost ..... H01L 23/3121
174/255

(Continued)

FOREIGN PATENT DOCUMENTS

KR    1020100059061 A    6/2010
KR    1020110125796 A    11/2011

*Primary Examiner* — Tuan T Dinh
(74) *Attorney, Agent, or Firm* — William Park & Associates Ltd.

(57) ABSTRACT

A semiconductor package includes a substrate including a core layer having a first surface and a second surface which is opposite to the first surface, a wiring layer formed over the first and second surfaces and in an inside of the core layer, and having a first electrode disposed in the inside of the core layer and exposed from the core layer and a second electrode disposed over the first surface, and a passivation layer formed over the first and second surface of the core layer such that the first and the second electrodes are exposed; a first semiconductor chip disposed over the first surface of the core layer; a second semiconductor chip stacked over the first semiconductor chip; a first connection member for connecting the first semiconductor chip with the first electrode; and a second connection member for connecting the second semiconductor chip with the second electrode.

9 Claims, 9 Drawing Sheets

(51) Int. Cl.
 *H05K 3/34* (2006.01)
 *H05K 3/46* (2006.01)
 *H05K 3/40* (2006.01)

(52) U.S. Cl.
 CPC ... *H05K 3/4015* (2013.01); *H05K 2201/0919* (2013.01); *H05K 2201/09845* (2013.01); *H05K 2201/10159* (2013.01); *H05K 2201/10287* (2013.01); *H05K 2201/10515* (2013.01); *Y02P 70/613* (2015.11)

(56) References Cited

U.S. PATENT DOCUMENTS

| | | | | |
|---|---|---|---|---|
| 6,043,559 | A * | 3/2000 | Banerjee | H01L 23/13 257/591 |
| 6,323,116 | B1 * | 11/2001 | Lamson | H01L 23/49822 257/E23.062 |
| 6,444,924 | B1 * | 9/2002 | Ishida | H01L 23/49816 174/260 |
| 7,786,571 | B2 * | 8/2010 | Chou | H01L 23/3677 257/706 |
| 2007/0187810 | A1 * | 8/2007 | Mok | H01L 23/13 257/686 |

* cited by examiner

SUBSTRATE FOR SEMICONDUCTOR PACKAGE AND SEMICONDUCTOR PACKAGE HAVING THE SAME

CROSS-REFERENCES TO RELATED APPLICATIONS

The present application claims priority under 35 U.S.C. 119(a) to Korean patent application number 10-2013-0135339 filed on Nov. 8, 2013, in the Korean Intellectual Property Office, which is incorporated herein by reference in its entirety.

TECHNICAL FIELD

The disclosure generally relates to a semiconductor package, and more particularly, to a substrate for a semiconductor package capable of possibly minimizing a package size and a semiconductor package having the same.

BACKGROUND

In the manufacture of semiconductor packages, a wire bonding technology in which electrodes of a semiconductor chip and electrodes of a printed circuit board are electrically connected using gold wires is widely used. For example, one end of the gold wire is attached to a bonding pad selected from bonding pads provided in the semiconductor chip and the other end of the gold wire is attached to a corresponding bond finger of the bond fingers provided in the printed circuit board.

Further, as the semiconductor packages have become lighter in weight and smaller in size, sizes of the electrodes and gaps between the electrodes have been continuously reduced. However, these reductions in sizes and gaps of the electrodes have been confronted with various obstructions, such as, limits regarding substrate fabricating technology, increase in electric resist, and signal delay due to mutual interference.

SUMMARY

In an embodiment, a substrate for a semiconductor package may include: a core layer having a first surface and a second surface which is opposite to the first surface; a wiring layer formed over the first and second surfaces and in an inside of the core layer, and may have a first electrode disposed in the inside of the core layer and exposed from the core layer and a second electrode disposed over the first surface; and a passivation layer formed over the first and second surface of the core layer such that the first and the second electrodes are exposed.

In an embodiment, a semiconductor package may include: a substrate including a core layer having a first surface and a second surface which is opposite to the first surface, a wiring layer formed over the first and second surfaces and in an inside of the core layer, and may have a first electrode disposed in the inside of the core layer and exposed from the core layer and a second electrode disposed over the first surface, and a passivation layer formed over the first and second surface of the core layer such that the first and the second electrodes are exposed; a first semiconductor chip disposed over the first surface of the substrate; a second semiconductor chip stacked over the first semiconductor chip; a first connection member for connecting the first semiconductor chip with the first electrode; and a second connection member for connecting the second semiconductor chip with the second electrode.

In an embodiment, an electronic system with a semiconductor package may include a controller, an interface, an input/output unit, and a memory coupled with one another through a bus. The memory may include a semiconductor package including: a substrate including a core layer having a first surface and a second surface which is opposite to the first surface, a wiring layer formed over the first and second surfaces and in an inside of the core layer, and may have a first electrode disposed in the inside of the core layer and exposed from the core layer and a second electrode disposed over the first surface, and a passivation layer formed over the first and second surface of the core layer such that the first and the second electrodes are exposed; a first semiconductor chip disposed over the first surface of the core layer; a second semiconductor chip stacked over the first semiconductor chip; a first connection member for connecting the first semiconductor chip with the first electrode; and a second connection member for connecting the second semiconductor chip with the second electrode.

In an embodiment, a memory card with a semiconductor package may include a memory and a controller for controlling the memory. The memory may include a semiconductor package including: a substrate including a core layer having a first surface and a second surface which is opposite to the first surface, a wiring layer formed over the first and second surfaces and in an inside of the core layer, and may have a first electrode disposed in the inside of the core layer and exposed from the core layer and a second electrode disposed over the first surface, and a passivation layer formed over the first and second surface of the core layer such that the first and the second electrodes are exposed; a first semiconductor chip disposed over the first surface of the core layer; a second semiconductor chip stacked over the first semiconductor chip; a first connection member for connecting the first semiconductor chip with the first electrode; and a second connection member for connecting the second semiconductor chip with the second electrode.

In an embodiment, a substrate for a semiconductor package may include a core layer, a wiring layer formed over the core layer and in an inside of the core layer, and having a first electrode disposed in the inside of the core layer and exposed from the core layer and a second electrode disposed over the core layer, and may include a passivation layer formed over the core layer exposing the first and the second electrodes.

DETAILED DESCRIPTION

The application provides a substrate of a multi-layered structure with electrodes, which may also be formed in a stepped shape. With such a substrate, wire bonding workability may be enhanced regardless of the size of a semiconductor package upon electrical connections between a semiconductor chip and the substrate using a conductive connection member such as a gold wire. Furthermore, a size of a semiconductor package may be reduced since it may not be necessary to ensure a gap between the electrodes.

Hereafter, various embodiments will be described in detail with reference to the accompanying drawings.

Figure 1:
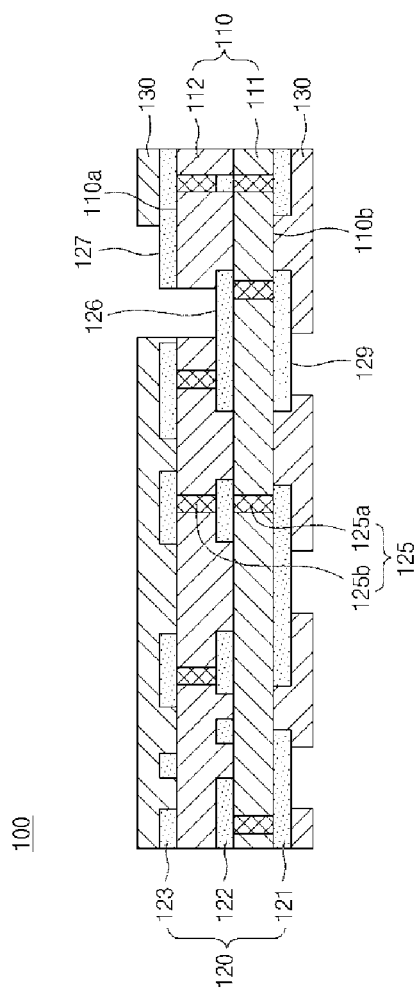
FIG. 1 is a cross-sectional view illustrating a substrate for a semiconductor package in accordance with an embodiment.

Referring to FIG. 1, a substrate 100 for a semiconductor package in accordance with an embodiment may include a core layer 110, wiring layer 120 and a passivation layer 130.

The core layer 110 may be formed of an insulating material and has a first surface 110a and a second surface 110b which is opposite to the first surface 110b. The core layer 110 may be formed including a plurality of layers. For example, the core layer 110 may include a first core layer 111 and a second core layer 112 disposed over the first core layer 111.

The wiring layer 120 may be formed of a conductive material and may be formed including a plurality of layers. For example, the wiring layer 120 may include a first wiring layer 121 formed over the second surface of the core layer 110, a second wiring layer 122 formed in the inside of the core layer 110 and a third wiring layer 123 formed over the first surface 110a of the core layer 110. In other words, the first wiring layer 121 may be formed over the lower surface of the first core layer 111; the second wiring layer 122 may be formed between the first core layer 111 and the second core layer 112; and the third wiring layer 123 may be formed over the upper surface of the second core layer 112. Although the wiring layer has three layers as shown in FIG. 1, the number of the layers in the wiring layer is not particularly limited thereto.

The passivation layer 130 may be formed over the first surface 110a and the second surface 110b of the core layer 110 to protect the wiring layer 120. For example, the passivation layer 130 may be formed of an insulating material such as a solder resist.

The core layer 110 may further include via pattern 125 for connecting the wiring layers 120 with one another. For example, the via pattern 125 may include a first via pattern 125a for electrically connecting the first wiring layer 121 and the second wiring layer 122 and a second via pattern 125b for electrically connecting the second wiring layer 122 and the third wiring layer 123.

The core layer 110 may include a first electrode 126 and a second electrode 127. The first and second electrodes 126 and 127 may be electrically coupled with bonding pads of the semiconductor chips disposed over the substrate 100 by medium of conductive connecting members.

The first and second electrodes 126 and 127 may be formed in different layers of the substrate. For example, the first electrode 126 may be formed in the inside of the core layer 110, i.e. in the second wiring layer 122, and the second electrode 127 may be formed over the first surface 110a of the core layer 110, i.e. in the third wiring layer 123 such that the second electrode 127 has a different topology from that of the first electrode 126.

The second surface 110b of the core layer 110, i.e. the lower surface of the first core layer 111 may be formed with or coupled with the first wiring layer 121. The first wiring layer 121 exposed from the passivation layer 130 may define locations where external connection electrodes 129 may be formed in the first wiring layer 121. Though not shown, external connection terminals such as solder balls may be formed over, or coupled to the external connection electrodes 129.

Figure 2:
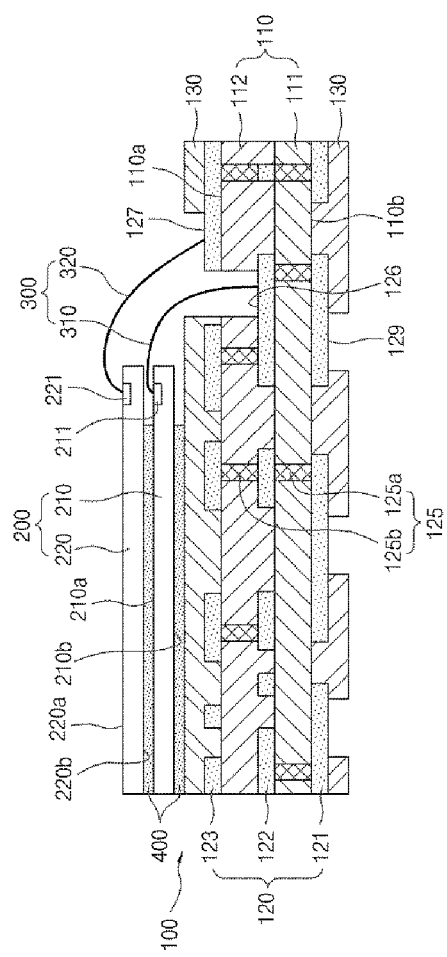
FIG. 2 is a cross-sectional view illustrating a semiconductor package in accordance with an embodiment.

Referring to FIG. 2, a semiconductor package in accordance with an embodiment. The semiconductor package may include the substrate 100, a plurality of semiconductor chips 200 and conductive connecting members 300.

The substrate 100 may include the core layer 110, the wiring layer 120 and the passivation layer 130, which are the same as those of the substrate for a semiconductor package shown in FIG. 1 and will not be described again in detail.

Each of the semiconductor chips 200 may have a first surface and a second surface which is opposite to the first surface. In an embodiment, the semiconductor chips 200 may be divided into a first semiconductor chip 210 and a second semiconductor chip 220 for the convenience sake of explanation. However, the number of the semiconductor chips 200 is not particularly limited to two and the number of the stacked semiconductor chips may be three or more.

A plurality of first bonding pads 211 may be formed over a first surface 210a of the first semiconductor chip 210. The first semiconductor chip 210 is adhered to the upper surface of the substrate 100 with its second surface 210b, and a spacer 400 is interposed between the substrate 100 and the first semiconductor chip 210. The first bonding pads 211 may be arranged two dimensionally in row and column directions over the first surface of the first semiconductor chip 210. For example, the first bonding pads 211 may be arranged in two rows over two opposite peripheries of the first semiconductor chip 210.

Similar to the first semiconductor chip 210, a plurality of second bonding pads 221 may be formed over a first surface 220a of the second semiconductor chip 220. The second semiconductor chip 220 is adhered to the first surface of the first semiconductor chip 210 with its second surface 220b, and a spacer 400 is interposed between the first semiconductor chip 210 and the second semiconductor chip 220.

The conductive connecting member 300 may include a first conductive connecting member 310 that electrically couples the first electrode 126 with the first bonding pad 211 of the first semiconductor chip 210 and a second conductive connecting member 320 that electrically couples the second electrode 127 with the second bonding pad 221 of the second semiconductor chip 220. The conductive connecting members may be metal wires e.g. formed of gold, copper or the like.

Figure 3:
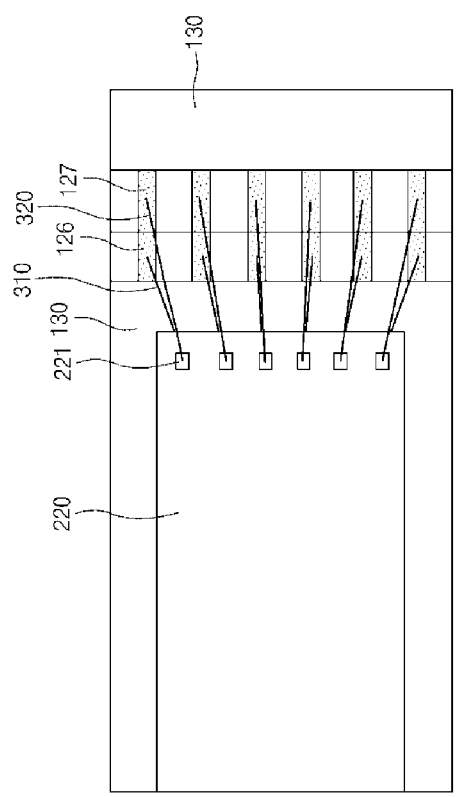
FIG. 3 is a plan view illustrating a semiconductor package in accordance with an embodiment.

Referring to FIG. 3, the first electrode 126 disposed adjacent to the first semiconductor chip 210 and the bonding pad 211 (see FIG. 2) of the first semiconductor chip 210 (see FIG. 2) may be easily electrically coupled with each other using the first conductive connecting member 310, e.g. a metal wire. Likewise, the second electrode 127 disposed on the outer periphery of the substrate 100 and the second bonding pad 221 of the second semiconductor chip 220 may be easily electrically coupled with each other using the second conductive connecting member 320. Here, there may be little to no interference between the first conductive connecting member 310 and the second conductive connecting member 320.

Since the first and second electrodes 126 and 127 are arranged over the wiring layers of the substrate that have different topologies, electrical connections between the bonding pad of the first semiconductor chip and the first electrode 126 as well as the bonding pad 221 of the second semiconductor chip 220 and the second electrode 127 disposed on the outer periphery of the substrate 100 may be easily established. Therefore, the semiconductor package in accordance with an embodiment need not to be formed with a separate space for wire bonding, and thus an overall size of the semiconductor package may be minimized.

Hereinafter, the process steps of manufacturing the semiconductor package having the structures as described above will be described.

Figure 4:
FIGS. 4 to 11 are cross-sectional views illustrating the process steps of manufacturing a semiconductor package of FIG. 2.

Referring to FIG. 4, a copper foil 120*a* for forming the first wiring layer is attached onto the second surface of the first core layer 111.

Figure 5:

Referring to FIG. 5, the copper foil may be patterned to form the first wiring layer 121. For example, the first wiring layer 121 may be formed, though not shown, using a process of forming an etch mask over the copper foil and then etching the copper foil layer.

Figure 6:
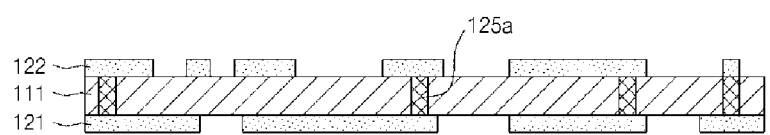

Referring to FIG. 6, via holes passing through the first core layer 111 are formed through a drilling process, and conductive metal is filled in the via holes to form the first via pattern 125*a* that is electrically coupled with the first wiring layer 121.

Thereafter, the first core layer 111 is turned upside down and then a copper foil for forming the second wiring layer 122 is attached onto the first surface of the first core layer 111 and patterned such that it is electrically coupled with the first wiring layer 121 through the first via pattern 125*a*.

Figure 7:
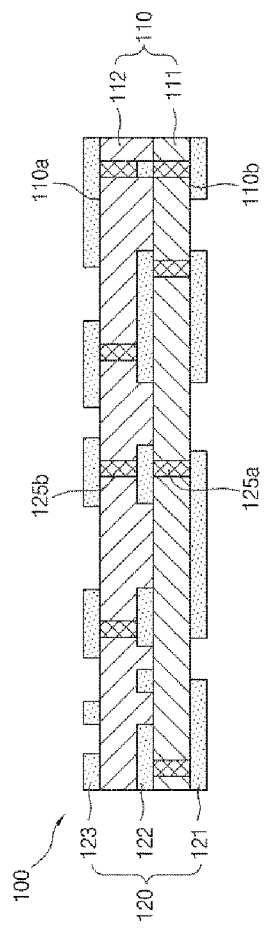

Referring to FIG. 7, the processes as described above are performed repeatedly to form the second core layer 112 and the third wiring layer 123. Specifically, the second core layer 112 is disposed over the second wiring layer 122, via holes passing through the second core layer 112 are formed through a drilling process, and then conductive metal is filled in the via holes to form the second via pattern 125*b*. Next, a copper foil is attached onto an upper surface of the second core layer 112 such that the copper foil is electrically coupled with the first wiring layer 121 and patterned in the process as described above to form the third wiring layer 123. Through these processes, a three-layer-structured substrate 100 may be formed. Furthermore, by repeating the same processes, a substrate having a four or more-layer-wiring structure may be formed.

Figure 8:
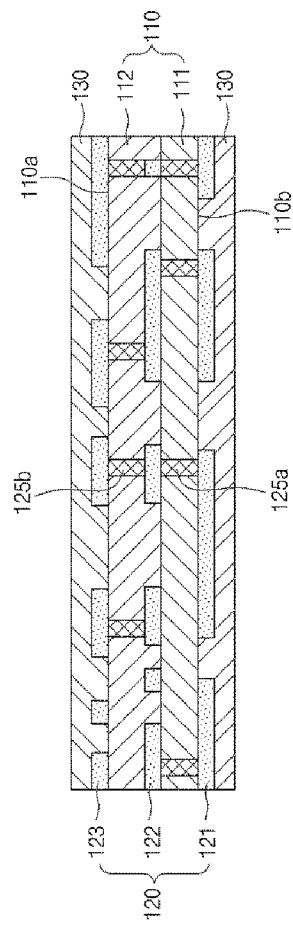

Referring to FIG. 8, the passivation layer 130 may be formed by applying an insulating material such as solder resist over the first and second surfaces 110*a* and 110*b* of the core layer 110 such that the first and third wiring layers 121 and 123 are covered by the insulating material.

Figure 9:
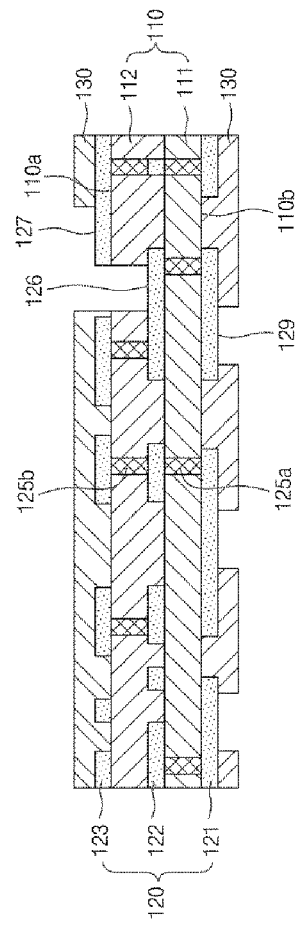

Referring to FIG. 9, portions of the passivation layer 130, the third wiring layer 123 and the second core layer 112 adjacent to a portion to which a semiconductor chip is bonded are etched to form the first electrode 126 in the second wiring layer 122. Thereafter, a portion of the passivation layer 130 next to the first electrode 126 is etched to form the second electrode 127 over the first wiring layer 121. Therefore, the first electrode 126 and the second electrode 127 have different topologies from each other by a predetermined height.

Figure 10:
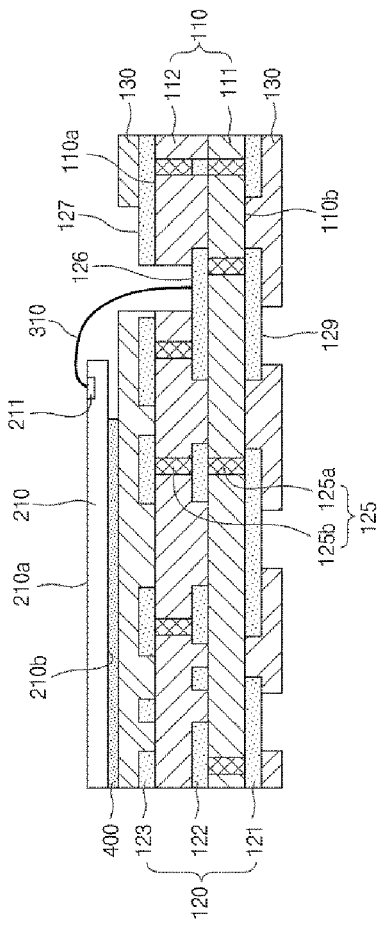

Referring to FIG. 10, the first semiconductor chip 210 may be attached onto the upper surface of the passivation layer 130 by medium of an adhesive, and the first bonding pad 211 of the first semiconductor chip 210 and the first electrode 126 are electrically coupled with each other by medium of the first conductive connection member 310 such as a metal wire or the like. A spacer 400 may be interposed between the substrate and the first semiconductor chip 210 for the sake of wire bonding workability.

Figure 11:
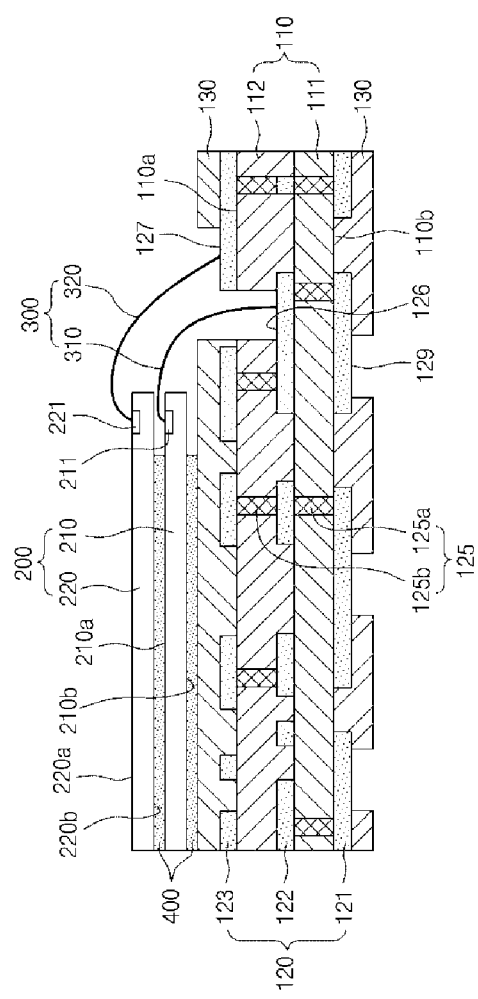

Referring to FIG. 11, the second semiconductor chip 220 is attached onto the first semiconductor chip 210 by medium of an adhesive, and the second bonding pad 221 of the second semiconductor chip 220 and the second electrode 127 are connected by the second conductive connection member 320. A spacer 400 may be interposed between the first semiconductor chip 210 and the second semiconductor chip 220 for the sake of wire bonding workability.

By connecting the first and second electrodes 126 and 127 having topology difference and bonding pads 211 and 221 of the semiconductor chips 210 and 220 with conductive connection members 310 and 320, respectively, it is not necessary to leave a separate gap between the electrodes in a semiconductor package with a limited size, thereby capable of improving wire bonding workability as well as minimizing a package size.

Figure 12:
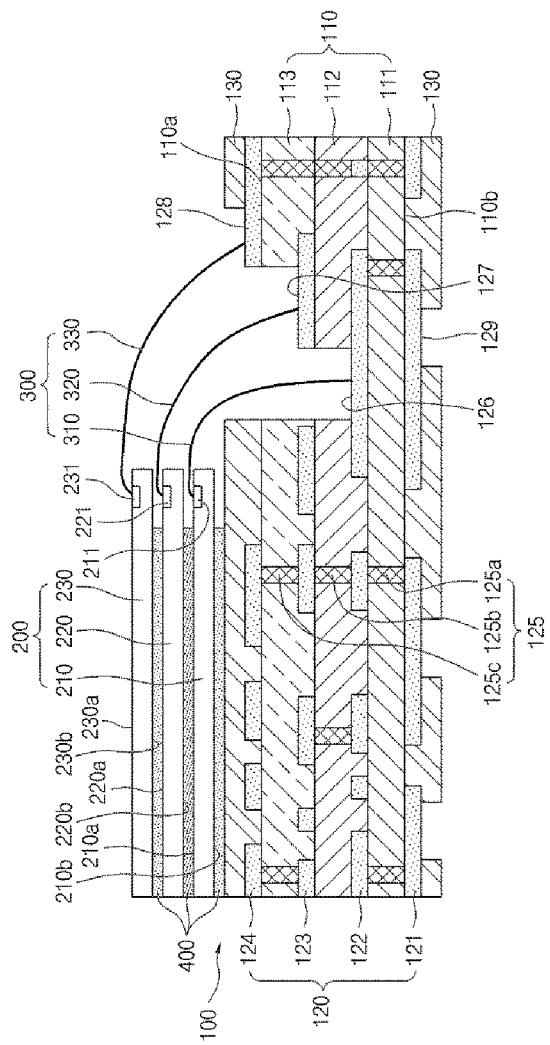
FIG. 12 is a cross-sectional view illustrating a semiconductor package in accordance with an embodiment.

Referring to FIG. 12, a semiconductor package in accordance with an embodiment may include a substrate 100, a plurality of semiconductor chips 200 and a conductive connection member 300, which are substantially the same as those of the substrate of the embodiments as described above. However, the substrate of FIG. 12 has increased numbers of the core layers, the wiring layers, the via patterns, and the stacked semiconductor chips. [Good]

The core layer 110 may be formed of an insulating material and has the first surface 110*a* and the second surface 110*b* which is opposite to the first surface 110*a*. The core layer 110 may be formed including a plurality of layers. For example, the core layer 110 may include the first core layer 111, the second core layer 112 disposed over the first core layer 111 and a third core layer 113 disposed over the second core layer 112.

The wiring layer 120 may be formed of a conductive material and may be formed including a plurality of layers. For example, the wiring layer 120 may include the first wiring layer 121 formed over the second surface 110*b* of the core layer 110, the second wiring layer 122 and the third wiring layer 123 formed in the inside of the core layer 110 and a fourth wiring layer 124 formed over the first surface 110*a* of the core layer 110. In other words, the first wiring layer 121 may be formed over the lower surface of the first core layer 111; the second wiring layer 122 may be formed between the first core layer 111 and the second core layer 112; the third wiring layer 123 may be formed between the second core layer 112 and the third core layer 113; and the fourth wiring layer 124 may be formed over the upper surface of the third wiring layer 113.

The core layer 110 may include the first electrode 126, the second electrode 127 and a third electrode 128. The first, second and third electrodes 126, 127 and 128 may be electrically coupled with bonding pads of the semiconductor chips disposed over the substrate 100 by medium of conductive connecting members 300, respectively.

The first, second and third electrodes 126, 127 and 128 may be formed such that they have different topologies from one another. For example, the first and second electrodes 126 and 127 may be formed in the inside of the core layer 110 and the third electrode 128 may be formed over the first surface 110*a* of the core layer, i.e. the fourth wiring layer 124 such that the third electrode 128 has a different topology from that of the second electrode 127. Also, the first and second electrode 126 and 127 formed in the inside of the core layer 110 are disposed such that they have different topologies from each other. Specifically, the first electrode 126 may be formed in the second wiring layer 122, and the second electrode 127 may be formed in the third wiring layer 123 such that the second electrode 127 has a different topology from that of the first electrode 126.

Each of the semiconductor chips 200 may have a first surface and a second surface which is opposite to the first surface. In an embodiment, the semiconductor chips 200 may be divided into a first semiconductor chip 210, a second semiconductor chip 220, and a third semiconductor chip 230 for the convenience sake of explanation. However, the number of the semiconductor chips 200 is not particularly limited to three and the number of the stacked semiconductor chips may be more.

A plurality of first bonding pads 211 may be formed over a first surface 210a of the first semiconductor chip 210. The first semiconductor chip 210 is adhered to the upper surface of the substrate 100 with its second surface 210b, and a spacer 400 is interposed between the substrate 100 and the first semiconductor chip 210. The first bonding pads 211 may be arranged two dimensionally in row and column directions over the first surface of the first semiconductor chip 210. For example, the first bonding pads 211 may be arranged in two rows over two opposite peripheries of the first semiconductor chip 210.

Similar to the first semiconductor chip 210, a plurality of second bonding pads 221 may be formed over a first surface 220a of the second semiconductor chip 220. The second semiconductor chip 220 is adhered to the first surface of the first semiconductor chip 210 with its second surface 220b, and a spacer 400 is interposed between the first semiconductor chip 210 and the second semiconductor chip 220.

Similar to the second semiconductor chip 220, a plurality of third bonding pads 231 may be formed over a first surface 230a of the third semiconductor chip 230. The third semiconductor chip 230 is adhered to the first surface 220a of the second semiconductor chip 220 with its second surface 230b, and a spacer 400 is interposed between the second semiconductor chip 220 and the third semiconductor chip 230.

The conductive connecting member 300 may include a first conductive connecting member 310 that electrically couples the first electrode 126 with the first bonding pad 211 of the first semiconductor chip 210 and a second conductive connecting member 320 that electrically couples the second electrode 127 with the second bonding pad 221 of the second semiconductor chip 220. The conductive connecting member 300 may include a third conductive connecting member 330 that electrically couples the third electrode 128 with the third bonding pad 231 of the third semiconductor chip 230. The conductive connecting members may be metal wires e.g. formed of gold, copper or the like.

The core layer 110 may further include via pattern 125 for connecting the wiring layers 120 with one another. For example, the via pattern 125 may include a first via pattern 125a for electrically connecting the first wiring layer 121 and the second wiring layer 122, a second via pattern 125b for electrically connecting the second wiring layer 122 and the third wiring layer 123, and a third via pattern 125c for electrically connecting the third wiring layer 123 and the fourth wiring layer 124.

The second surface 110b of the core layer 110, i.e. the lower surface of the first core layer 111 may be formed with or coupled with the first wiring layer 121. The first wiring layer 121 exposed from the passivation layer 130 may define locations where external connection electrodes 129 may couple to or be formed in the first wiring layer 121. Though not shown, external connection terminals such as solder balls or ball lands may be formed over, coupled to, or formed in the external connection electrodes 129.

The semiconductor package in accordance with various embodiments may be applied to a variety of semiconductor apparatus and package modules.

Figure 13:
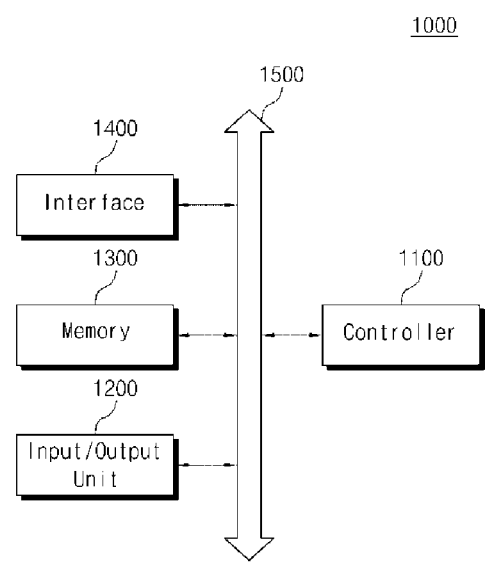
FIG. 13 is a block diagram showing an electronic system to which the semiconductor package in accordance with various embodiments is applied.

Referring to FIG. 13, the semiconductor package in accordance with various embodiments may be applied to an electronic system 1000. The electronic system 1000 may include a controller 1100, an input/output unit 1200, and a memory 1300. The controller 1100, the input/output unit 1200 and the memory 1300 may be coupled with one another through a bus 1500, which serves as a path through which data move.

The controller 1100 may include at least any one of the following: one or more microprocessors, one or more digital signal processors, one or more microcontrollers, and logic devices capable of performing the same functions as these components. The controller 1100 and the memory 1300 may include the stacked package according to the various embodiments discussed above. The input/output unit 1200 may include at least one selected among a keypad, a keyboard, a display device, a touch screen and so forth. The memory 1300 may store data and/or commands to be executed by the controller 1100 and the like.

The memory 1300 may include a volatile memory device and/or a nonvolatile memory device, such as a flash memory. For example, a flash memory to which the technology of the present invention is applied may be mounted to an information processing system such as a mobile terminal or a desktop computer. The flash memory may be constituted by a solid state drive (SSD). In this case, the electronic system 1000 may stably store a large amount of data in a flash memory system.

The electronic system 1000 may further include an interface 1400 configured to transmit and receive data to and from a communication network. The interface 1400 may be a wired or wireless type. For example, the interface 1400 may include an antenna or a wired (or wireless) transceiver. The electronic system may be provided with an application chipset, an input/output device and the like.

The electronic system 1000 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 1000 is equipment capable of performing wireless communication, the electronic system 1000 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 14:
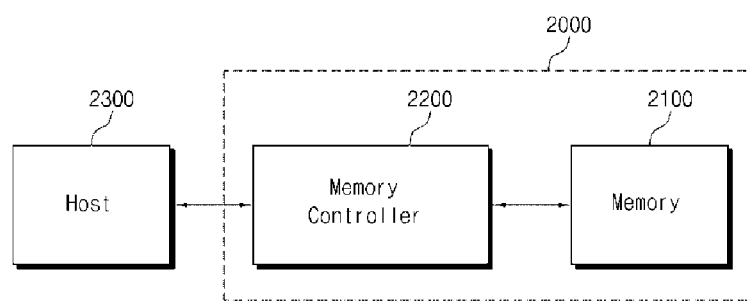
FIG. 14 is a block diagram illustrating a memory card which may include the semiconductor package in accordance with various embodiments.

Referring to FIG. 14, the semiconductor package in accordance with the various embodiments discussed above may be provided in the form of a memory card 2000. For example, the memory card 2000 may include a memory 2100 such as a nonvolatile memory device and a memory controller 2200. The memory 2100 and the memory controller 2200 may store data or read stored data.

The memory 2100 may include the stacked package in accordance with the various embodiments discussed above. The memory controller 2200 may control the memory 2100 such that stored data is read out or data is stored in response to a read/write request from a host 2300.

While various embodiments have been described with respect to the figures, it will be apparent to those skilled in the art that various changes and modifications may be made without departing from the spirit and scope of the application as defined in the following claims.

What is claimed is:

1. A semiconductor package, comprising:
   a substrate including:
   a core layer having a first surface and a second surface which is opposite to the first surface,
   a wiring layer formed over the first and second surfaces and in an inside of the core layer, and having a first electrode disposed in the inside of the core layer exposed from the core layer and a second electrode disposed over the first surface, and
   a passivation layer formed over the first and second surface of the core layer such that the first and the second electrodes are exposed;
   a first semiconductor chip disposed over the first surface of the core layer;
   a second semiconductor chip stacked over the first semiconductor chip;
   a first connection member for coupling the first semiconductor chip with the first electrode; and
   a second connection member for coupling the second semiconductor chip with the second electrode.

2. The semiconductor package of claim 1,
   wherein the core layer including the wiring layer includes a first core layer,
   wherein the core layer including the wiring layer includes a second core layer formed over the first core layer,
   wherein the wiring layer includes a first wiring layer formed over a lower surface of the first core layer,
   wherein the wiring layer includes a second wiring layer formed between the first core layer and the second core layer, and
   wherein the wiring layer includes a third wiring layer formed over an upper surface of the second core layer.

3. The semiconductor package of claim 1, wherein the core layer including the wiring layer includes:
   a first core layer;
   a second core layer formed over the first core layer; and
   a third core layer formed over the second core layer.

4. The semiconductor package of claim 1, wherein the first and second connection members are conductive wires.

5. The semiconductor package of claim 1, further comprising spacers interposed between the substrate and the first semiconductor chip and between the first semiconductor chip and the second semiconductor chip.

6. The semiconductor package of claim 2, wherein the wiring layer further includes:
   a first via pattern connecting the first wiring layer with the second wiring layer; and
   a second via pattern connecting the second wiring layer with the third wiring layer.

7. The semiconductor package of claim 2,
   wherein the wiring layer includes a first wiring layer formed over a lower surface of the first core layer; and
   wherein the semiconductor package further comprises external connection electrodes formed in portions of the first wiring layer.

8. The semiconductor package of claim 3,
   wherein the wiring layer includes a first wiring layer formed over a lower surface of the first core layer,
   wherein the wiring layer includes a second wiring layer formed between the first core layer and the second layer,
   wherein the wiring layer includes a third wiring layer formed between the second core layer and the third core layer,
   wherein the wiring layer includes a fourth wiring layer formed over an upper surface of the third core layer,
   wherein the wiring layer further includes a first via pattern connecting the first wiring layer with the second wiring layer,
   wherein the wiring layer further includes a second via pattern connecting the second wiring layer with the third wiring layer, and
   wherein the wiring layer further includes a third via pattern connecting the third wiring layer with the fourth wiring layer.

9. The semiconductor package of claim 8, further comprising a third electrode disposed over the third core layer.

* * * * *